(12) United States Patent
Duvvury et al.

(10) Patent No.: US 6,534,833 B1
(45) Date of Patent: Mar. 18, 2003

(54) SEMICONDUCTOR DEVICE WITH PROTECTION CIRCUITRY AND METHOD

(75) Inventors: Charvaka Duvvury, Plano, TX (US); Michael D. Chaine, Missouri City, TX (US); Puvvada Venugopal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/040,763

(22) Filed: Mar. 18, 1998

(51) Int. Cl.[7] .............................................. H01L 29/72
(52) U.S. Cl. ...................... 257/355; 257/356; 257/357; 257/358
(58) Field of Search ................................ 257/355, 356, 257/357, 358

(56) References Cited

U.S. PATENT DOCUMENTS

| | | | |
|---|---|---|---|
| 4,692,781 A | | 9/1987 | Rountree et al. ........ 357/23.13 |
| 4,855,620 A | * | 8/1989 | Duvvury et al. ............ 257/355 |
| 4,939,616 A | | 7/1990 | Rountree ..................... 361/56 |

* cited by examiner

Primary Examiner—Edward Wojciechowicz
(74) Attorney, Agent, or Firm—Frederick J. Telecky, Jr.; W. James Brady, III

(57) ABSTRACT

The invention comprises a semiconductor device with protection circuitry and a method of protecting an integrated circuit from electrostatic discharge. One aspect of the invention is a semiconductor device with protection circuitry which comprises an integrated circuit having at least one bond pad. A protection circuit is electrically connected to the bond pad and is operable to prevent damage to the integrated circuit during an electrostatic discharge event. The protection circuit comprises a first MOSFET having a first gate electrode connected in series with a second MOSFET having a second gate electrode wherein the first gate electrode and second gate electrode are commonly controlled in response to an electrostatic discharge event.

16 Claims, 1 Drawing Sheet

SEMICONDUCTOR DEVICE WITH PROTECTION CIRCUITRY AND METHOD

TECHNICAL FIELD OF THE INVENTION

This invention relates generally to integrated circuits and more particularly to a semiconductor device with protection circuitry and a method of protecting an integrated circuit from electrostatic discharge.

BACKGROUND OF THE INVENTION

Modern integrated circuits, particularly metal oxide semiconductor (MOS) integrated circuits, commonly employ protection circuits at the input and/or output paths to prevent damage to the integrated circuit caused by electrostatic discharge. As devices are made smaller, they become more sensitive to high voltage electrostatic discharge. During installation of integrated circuits, electrostatic discharge may destroy integrated circuits and may require expensive and tedious repairs on fully manufactured devices which could have been avoided by providing a mechanism for dissipation of the electrostatic discharge on the integrated circuit itself. MOS devices are particularly sensitive as high voltage electrostatic discharge may easily destroy the very thin gate oxides and short channel devices of the integrated circuit.

One commonly used circuit for electrostatic discharge protection is an N-channel MOSFET with the drain electrically connected to an integrated circuit bond pad, its source grounded and its gate connected to ground through a resistive load. Unfortunately, the breakdown voltage of commonly used NMOS transistors may limit the use of this type of circuit for certain applications. One application where use of a single NMOS transistor is problematic is protection for the programming pin in an EPROM type device. The programming voltage ordinarily exceeds the voltage of other signals used to control the EPROM. In addition, the programming voltage may typically be higher than the breakdown voltage of MOS transistors ordinarily used for electrostatic discharge protection. Use of a single MOSFET for electrostatic discharge protection on an EPROM programming pin, then, may interfere with the proper programming of the device.

Field oxide protection devices may be used but are ineffective for more advanced technologies. In some cases, the cycling of the VPP Voltage builds up to result in electrical overstress (EOS) damage on the protection device. Therefore, a sufficient margin between the protection device turn on and the VPP program pin voltage swings is needed.

SUMMARY OF THE INVENTION

The invention comprises a semiconductor device with protection circuitry and a method of protecting an integrated circuit from electrostatic discharge. One aspect of the invention is a semiconductor device with protection circuitry comprising an integrated circuit with at least one bond pad. A protection circuit is electrically connected to the bond pad and is operable to prevent damage to the integrated circuit during an electrostatic discharge event. The protection circuit comprises a first MOSFET having a first gate electrode connected in series with a second MOSFET having a second gate electrode wherein the first gate electrode and second gate electrode are commonly controlled in response to an electrostatic discharge event.

The invention has several important technical advantages. The invention provides an efficient, easy to use circuit to protect high voltage circuitry electrically connected to a bond pad of an integrated circuit. For example, the invention may be used to protect circuitry connected to input and output pins of an integrated circuit. One example where the invention is particularly useful is the programming pin of an EPROM. The term, "pin," is used broadly and is meant to refer to any conductor connected in some way to a bond pad of an integrated circuit. Thus, the invention may be used for electrostatic discharge protection in integrated circuits having any type of packaging. Because the invention employs two MOSFETs for electrostatic discharge protection, it may be manufactured while the remainder of the protected integrated circuit is manufactured using conventional processes. The invention may also be used as an efficient output protection scheme for floating substrate and non-epi substrate technologies. In addition, the invention may be used to provide further protection to MOSFETs in the integrated circuit by creating a substrate bias.

BRIEF DESCRIPTION OF THE DRAWINGS

For a more complete understanding of the present invention and the advantages thereof, reference is now made to the following descriptions, taken in conjunction with the accompanying drawings, in which.

DETAILED DESCRIPTION OF THE INVENTION

The preferred embodiment of the present invention and its advantages are best understood by referring to FIGS. 1–4 of the drawings, like numerals being used for like and corresponding parts of the various drawings.

Figure 1:
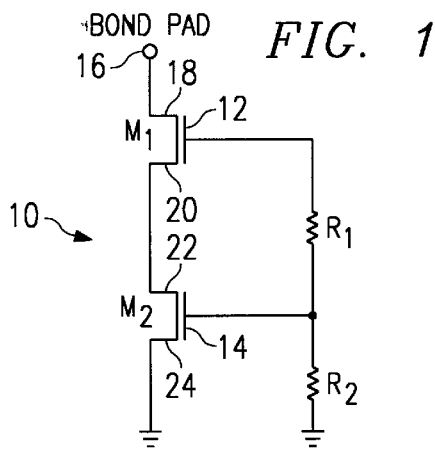
FIG. 1 illustrates a schematic diagram of a first embodiment of a protection circuit for an integrated circuit constructed in accordance with the teachings of the invention.

FIG. 1 illustrates a first embodiment of a protection circuit for an integrated circuit constructed in accordance with the invention. Protection circuit 10 comprises MOSFETs $M_1$ and $M_2$ connected in series. Gate electrode 12 of MOS transistor $M_1$ and gate electrode 14 of MOS transistor $M_2$ are commonly controlled in response to a transient such as an electrostatic discharge event. The drain of MOS transistor $M_1$ is electrically connected to a bond pad 16 of an integrated circuit (not explicitly shown). In this embodiment, MOS transistors $M_1$ and $M_2$ are NMOS devices and will most commonly be chosen to be such, but could be PMOS devices without departing from the scope of the invention.

Protection circuit 10 further comprises resistors $R_1$ and $R_2$. Resistor $R_1$ is connected between gate electrode 12 and gate electrode 14 while resistor $R_2$ is connected between gate electrode 14 and ground. Although resistor $R_2$ is preferably connected to ground, resistor $R_2$ could be connected to a different reference potential without departing from the scope of the invention. In addition, resistor $R_1$ or resistor $R_2$ could be replaced by a direct electrical connection with a low resistance. In other words, resistor $R_1$ could be omitted and gate electrode 12 connected to gate electrode 14 through a direct electrical connection with low resistance. The term "low resistance" could refer to a connection with no resistance at all. Similarly, $R_2$ could be replaced by a direct electrical connection with low resistance between gate electrodes 14 and ground. Accordingly, a more general description of protection circuit 10 would be that there is a circuit element connected between gate electrode 12 and gate electrode 14 and a circuit element connected between gate electrode 14 and a reference potential. The circuit element could be a resistor, a direct electrical connection, or some other circuit element.

Protection circuit 10 may be connected directly to a bond pad and located near the bond pad or could be electrically connected to the bond pad but located elsewhere. For example, protection circuit 10 may be connected between a power bus and ground bus or between the programming voltage bus and the ground bus. Optionally, multiple protection circuits 10 could be electrically connected to a bond pad in parallel.

The operation of protection circuit 10 will now be described. When an electrostatic discharge is received at bond pad 16, a high voltage initially appears on drain 18 of MOS transistor $M_1$. Due to capacitive coupling between drain 18 and gate electrode 12, the voltage will quickly rise on gate electrode 12 as well. Due to coupling between gate electrode 12 and source 20 of MOS transistor $M_1$ and capacitive coupling between drain 22 and gate electrode 14 of MOS transistor $M_2$, the voltage also rises quickly on gate electrode 14 of MOS transistor $M_2$. The pad voltage on bond pad 16 rises until the combined breakdown voltage of MOS transistors $M_1$ and $M_2$ is reached. The use of resistors $R_1$ and $R_2$ allows gate electrodes 12 and 14 to attain a voltage higher than ground. Allowing gate electrodes 12 and 14 to attain a potential during an electrostatic discharge causes lowering of the breakdown voltage of MOS transistors $M_1$ and $M_2$ compared to the breakdown voltage that would result if gate electrodes 12 and 14 were connected to ground. Once the combined breakdown voltage of $M_1$ and $M_2$ is reached, then the voltage on bond pad 16 decays to a level of the combined snapback holding voltage of MOS transistors $M_1$ and $M_2$.

Figure 3:
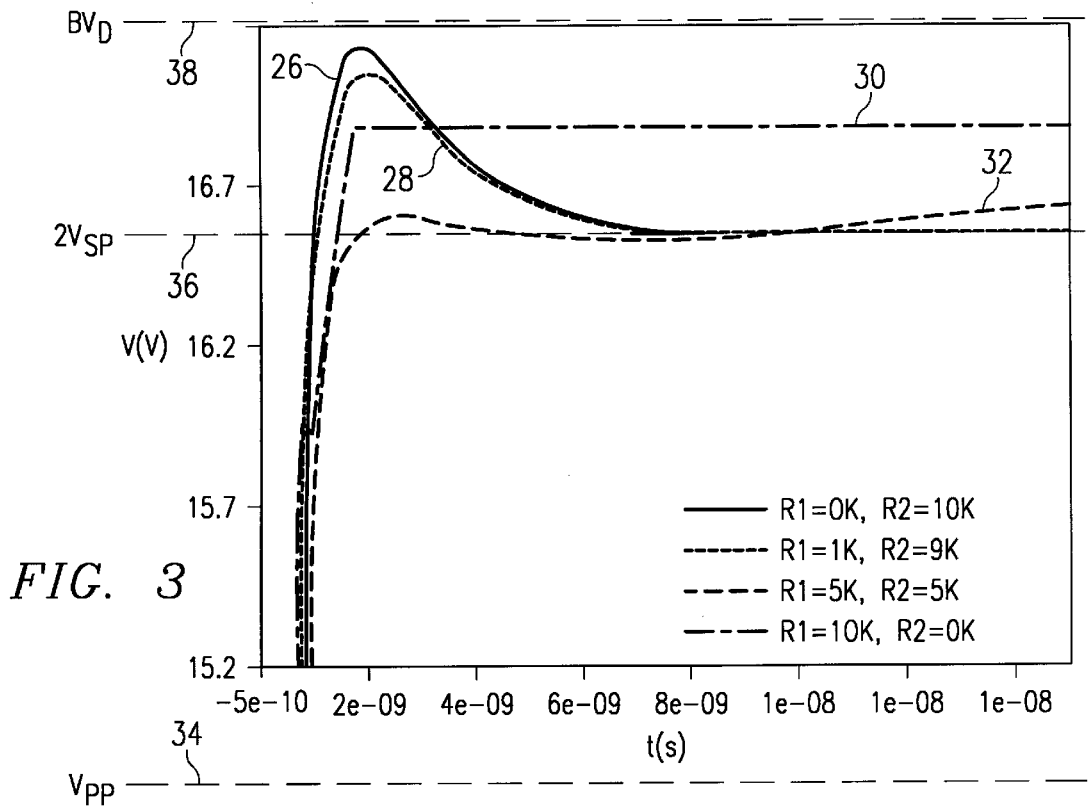
FIG. 3 illustrates a graph of pad voltage versus time that was obtained by simulating example embodiments of the protection circuit of the present invention.

FIG. 3 illustrates a graph of voltage on bond pad 16 versus time during a simulated electrostatic discharge. This graph will be utilized to discuss certain design considerations that should be addressed when designing protection circuit 10.

The graph illustrated in FIG. 3 shows four curves 26, 28, 30 and 32, each representing the voltage on bond pad 16 versus time for varying choices of the value for $R_1$ and $R_2$. Based upon this simulation, resistors $R_1$ and $R_2$ should preferably be between 5–10 kohms and should be of equal value.

$R_1$ and $R_2$ could be of any other larger value, for example, 10K or 15K. The resistor value is selected by practical considerations.

The graph of FIG. 3 also denotes three reference voltages. Reference voltage, $V_{pp}$, indicated by line 34 comprises the normal operating signal level on bond pad 16. The sum of the breakdown voltages of MOS transistors $M_1$ and $M_2$ should be chosen to be greater than $V_{pp}$, otherwise the protection circuit will interfere with the operation of the integrated circuit. Similarly, the sum of the snapback voltages of MOS transistors $M_1$ and $M_2$ should be chosen to be greater than $V_{pp}$ for the same reason.

The voltage level $2V_{sp}$, indicated by line 36, represents twice the snapback holding voltage of an MOS transistor constructed like MOS transistors $M_1$ and $M_2$. In other words, this voltage represents the combined snapback voltage of transistors $M_1$ and $M_2$.

Voltage $BV_D$ indicated by line 38 represents the diode breakdown voltage of transistors $M_1$ and $M_2$. A heavily doped region such as drain 18, source 20, drain 22, or source 24 of MOS transistors $M_1$ and $M_2$ in combination with a lightly doped substrate forms a diode. If the voltage difference between the substrate and the heavily doped region, such as drain 18, reaches the breakdown voltage of this diode, then current flows between the heavily doped region and the substrate. Because such diode conductance is an inefficient method of absorbing an electrostatic discharge, protection circuit 10 should be designed such that the combined breakdown voltage of MOS transistors $M_1$ and $M_2$ is below the diode breakdown voltage, $BV_D$, to prevent diode breakdown from occurring.

Curve 26 illustrates the voltage on bond pad 16 versus time for protection circuit 10 with $R_1$ set to 0 and $R_2$ set to 10 kohms. Curve 28 represents the operation of protection circuit 10 where $R_1$ is 1 kohm and $R_2$ is 9 kohms. Both curves 26 and 28 have the undesirable characteristic that the combined breakdown voltage of transistor $M_1$ and $M_2$ indicated by the peak of curves 26 and 28, is close to the diode breakdown voltage, $BV_D$. If $R_1 = R_2 = 0$, then the combined breakdown voltage would likely exceed $BV_D$.

Curve 30 represents the operation of protection circuit 10 where $R_1$ is set to 10 kohms and $R_2$ is set to 0 ohms. This embodiment has the undesirable characteristic that the voltage on bond pad 16 is initially significantly higher than the sum of the snapback voltages of MOS transistors $M_1$ and $M_2$ indicated by line 36. In addition, the voltage on the pad 16 decays more slowly as compared to other embodiments.

Curve 32 represents the operation of protection circuit 10 where $R_1$ and $R_2$ are both set to 5 kohms. In this example, protection circuit 10 has the desirable characteristic that the combined breakdown voltage of transistors $M_1$ and $M_2$, indicated by the peak of curve 32, is close to the combined snapback holding voltage of transistors $M_1$ and $M_2$, indicated by line 36. The combined breakdown voltage for the embodiment represented by curve 32 is thus comfortably below the diode breakdown voltage, $BV_D$, and comfortably above the ordinary signal operating voltage, $V_{PP}$. This embodiment thus has the desirable characteristic of avoiding diode breakdown between heavily doped portions of MOS transistors $M_1$ and $M_2$ and the semiconductor substrate. In addition, this embodiment avoids interference with the circuitry it is protecting because it has a combined breakdown voltage and a combined snapback voltage exceeding $V_{PP}$.

Some additional observations about protection circuit 10 may be helpful. Resistors $R_1$ and $R_2$ are preferably 5–10 kohms and of equal value. The total breakdown voltage of MOS transistors $M_1$ and $M_2$ and protection circuit 10 is lower than it would be if gate electrodes 12 and 14 were both grounded. This lower total breakdown voltage results from the fact that allowing a bias on gate electrodes 12 and 14 lowers the breakdown voltage of transistors $M_1$ and $M_2$ respectively.

The coupling of the voltage on bond pad 16 to gate electrodes 12 and 14 is determined by the ratio of $R_1$ or $R_2$ to the total resistance $R_1 + R_2$. If $R_1$ equals 0, then the coupling on gate electrode 12 and gate electrode 14 would be the same. If $R_2$ equals 0, then the coupling on gate electrode 12 would be high, but the coupling on gate electrode 14 would be 0. With $R_2$ equal to 0, the combined breakdown voltage of transistors $M_1 + M_2$ would be higher than desired, as was illustrated in FIG. 3. However, the invention includes such embodiments.

Because the sum of the snapback holding voltages of transistors $M_1$ and $M_2$ will ordinarily be comfortably below the diode breakdown voltage $BV_D$, the ideal total breakdown voltage for transistors $M_1 + M_2$ is equal to twice the snapback holding voltage. As illustrated in FIG. 3, setting resistors $R_1$ and $R_2$ to be equal to one another as represented by curve 32 comes closest to meeting this ideal.

Thus, the value of resistors $R_1$ and $R_2$ can be adjusted until a high gate potential appears at gate electrode 12 and a lower potential appears at gate electrode 14. The circuit may preferably be designed such that the voltage at gate electrode 12 minus the voltage on source 20 exceeds the threshold voltage of transistor $M_1$. If this condition is not met, then protection circuit 10 will not achieve an efficient bipolar effect in response to an electrostatic discharge. Similarly, the voltage on gate electrode 12 should be chosen such that it exceeds the threshold voltage of MOS transistor $M_2$ for the same reason. At the same time, the voltage on gate electrode 14 should be controlled so that it is always lower than the maximum operating voltage of MOS transistor $M_2$ so as to avoid damaging the oxide of MOS transistor $M_2$.

As noted above, the voltage on gate electrodes 12 and 14 through capacitive coupling responds to an electrostatic discharge event on bond pad 16. The voltage on gate electrodes 12 and 14 will then decay to zero with a time constant determined by the coupling capacitance and the values of resistors $R_1$ and $R_2$. To provide adequate protection, protection circuit 10 may preferably be designed such that transistors $M_1$ and $M_2$ are on for at least 5 nanoseconds in response to an electrostatic discharge event. Conductance for this period of time will allow as much generation of current as possible, leading to faster bipolar response of protection circuit 10.

During conductance, the substrate current generation is also high in both devices leading to better NPN turn on.

Protection circuit 10 can also be used for other applications. One example is to bias the substrate for an output MOS transistor having a floating substrate design or non-epi substrate design. For a dynamic RAM or a non-epi substrate, the resistance of the substrate is a few hundred ohms. In such a case, $R_2$ of protection circuit 10 can be designed so that the substrate voltage is approximately equal to 0.6 volts. This voltage may be transiently applied to the substrate of NMOS transistors to provide better protection to MOS transistors during an electrostatic discharge event. In such a case, the resistors should be chosen such that the voltage on gate electrode 12 times the ratio of the parallel combination of $R_2$ and the substrate resistance to the sum of $R_1$ and the parallel combination of $R_2$ and the substrate resistance is equal to 0.6 volts.

Figure 2:
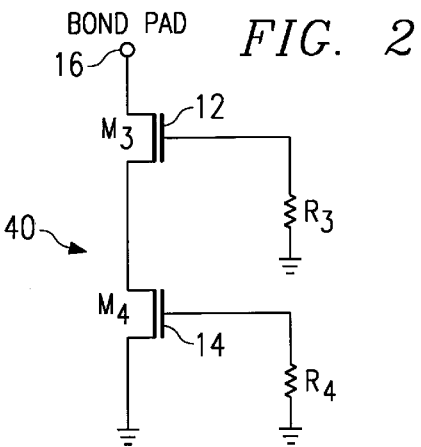
FIG. 2 illustrates a second embodiment of a protection circuit for an integrated circuit constructed in accordance with the teachings of the invention.

FIG. 2 illustrates a second protection circuit 40 comprising a second embodiment of the invention. In this embodiment, gate electrode 12 of transistor $M_3$ is connected to resistor $R_3$, which is connected to ground. Gate electrode 14 of MOS transistor $M_4$ is connected to resistor $R_4$ which is connected to ground. MOS transistors $M_3$ and $M_4$ are preferably NMOS devices but could be PMOS devices without departing from the scope of the invention. As was the case with protection circuit 10 of FIG. 1, a different reference potential other than ground could be used for connection of resistors $R_3$ and $R_4$. Also, as described above, resistors $R_3$ and $R_4$ could be replaced by other circuit elements such as a direct electrical connection with low resistance between gate electrode 12 and ground or between gate electrode 14 and ground.

Figure 4:
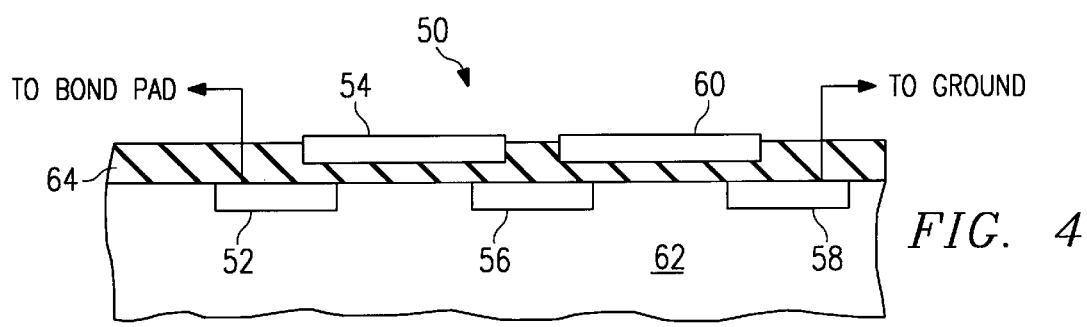
FIG. 4 illustrates a cross-sectional view of a portion of an embodiment of a protection circuit constructed in accordance with the invention.

FIG. 4 illustrates a cross-sectional view of an input protection circuit 50 constructed in accordance with the invention. This embodiment, like the embodiments discussed in connection with FIGS. 1–3 above employs two MOS transistors connected in series with gate electrodes that are commonly controlled in response to an electrostatic discharge event. In this embodiment, however, the source of the first MOS transistor also serves as the drain of the second MOS transistor.

Protection circuit 50 comprises first heavily doped region 52, first gate electrode 54, second heavily doped region 56, second gate electrode 60, and third heavily doped region 58. In this embodiment, the MOS transistors comprise NMOS transistors and heavily doped regions 52, 56 and 58 are heavily doped N-type material. Again, PMOS devices could be used without departing from the scope of the invention.

Heavily doped regions 52, 56 and 58 comprise doped regions of substrate 62. Oxide layer 64 separates heavily doped regions 52, 56 and 58 from gate electrodes 54 and 60. First heavily doped region 52, which serves as the drain of a first MOS transistor, is connected to a bond pad 16 of the integrated circuit. The third heavily doped region 58 is connected to a reference potential, which is ground in this embodiment. Although not explicitly shown, resistors may be connected between first gate electrode 54 and second gate electrode 60 as well as between second gate electrode 60 and a reference potential such as ground. Such connections would be consistent with the embodiment illustrated in FIG. 1. Also, as discussed with regard to FIG. 1, these resistors could also be other circuit elements such as direct electrical connections with low resistance. Similarly, first gate electrode 54 and second gate electrode 60 could be connected through resistors or other circuit elements to a reference potential such as ground consistent with the embodiment illustrated in FIG. 2.

First gate electrode 54 is disposed outwardly from portions of first heavily doped region 52 and second heavily doped region 56 and the area between them. Similarly, second gate electrode 60 is disposed outwardly from portions of second heavily doped region 56 and third heavily doped region 58 and the area between them. Note that in this embodiment, portions of first gate electrode 54 overlap with first heavily doped region 52 and second heavily doped region 56. Similarly, portions of second gate electrode 60 overlap with portions of second heavily doped region 56 and third heavily doped region 58. These overlaps increase the capacitance between the gate electrodes and the respective heavily doped region, thus increasing coupling between the gate electrodes and the heavily doped regions. Such coupling is desirable for a protection circuit 50 so as to increase the capacitive coupling between the source and gate electrode as well as between the drain and gate electrode of each MOS transistor.

First heavily doped region 52 serves as the drain of the first MOS transistor while first gate electrode 54 serves as the gate electrode of the first MOS transistor. Second heavily doped region 56 serves as the source of the first MOS transistor as well as serving as the drain of the second MOS transistor. Second gate electrode 60 serves as the gate of the second MOS transistor while third heavily doped region 58 serves as the source of the second MOS transistor.

When a resistor is connected between first gate electrode 54 and second gate electrode 60 as well as between second gate electrode 60 and ground, then the operation of protection circuit 50 is similar to the operation of protection circuit 10 illustrated in FIG. 1. The advantage of using the second heavily doped region 56 as a merged drain and source is that protection circuit 50 responds more efficiently to an electrostatic discharge. When the transistor represented by first gate electrode 54 turns on and avalanches, it generates many carriers which get pulled into substrate 62. The presence of the carriers in substrate 62 in the area adjacent to the transistor controlled by second gate electrode 60 causes the second transistor to turn on more easily. The excess carriers from the first transistor locally bias the substrate in the locality of the second transistor. If two ordinary MOSFETs are used rather than employing the merged source drain region represented by second heavily doped region 56, then this local bias will not ordinarily be seen by the second transistor.

Although the present invention has been described in detail, it should be understood that various changes, substitutions, and alterations can be made hereto without departing from the spirit and scope of the invention as defined by the appended claims.

What is claimed is:

1. A semiconductor device, comprising:
   at least one bond pad;
   a protection circuit electrically connected to the bond pad and operable to prevent damage to circuit connected to the bond pad during an electrostatic discharge event, the protection circuit comprising:
   a first MOSFET having a first gate electrode, a first source, a first drain and a first electrical conductive path between the first source and the first drain, wherein the first electrical conductive path is connected to the bond pad;
   a second MOSFET having a second gate electrode, a second source, a second drain, and a second electrical conductive path between the second source and the second drain wherein the second electrical conductive path is connected to the first electrical conductive path;
   and wherein the first gate electrode and the second gate electrode are commonly controlled by capacitive coupling in response to an electrostatic discharge event voltage at the bond pad.

2. The semiconductor device of claim 1, further comprising:
   a first circuit element connected between the first gate electrode and the second gate electrode; and
   a second circuit element connected between the second gate electrode and a reference potential.

3. The semiconductor device of claim 2 wherein the reference potential comprises ground.

4. The semiconductor device of claim 2, wherein the first circuit element comprises a direct electrical connection with a low resistance.

5. The semiconductor device of claim 2, wherein the second circuit element comprises a direct electrical connection with a low resistance.

6. The semiconductor device of claim 2, wherein the first and second circuit elements each comprise resistors.

7. The semiconductor device of claim 2, wherein the first and second circuit elements comprise resistors with approximately equivalent resistance values and wherein the reference potential comprises ground.

8. The semiconductor device of claim 1, further comprising:
   a first circuit element connected between the first gate electrode and a first reference potential; and
   a second circuit element connected between the second gate electrode and a second reference potential.

9. The semiconductor device of claim 8, wherein the first and second circuit elements each comprise resistors and the first and second reference potentials each comprise ground.

10. The semiconductor device of claim 1, wherein the first and second MOSFETs collectively comprise:
    a first heavily doped region electrically connected to the bond pad;
    a third heavily doped region electrically connected to a reference potential;
    a second heavily doped region disposed between the first and third heavily doped regions; and wherein the first gate electrode is disposed outwardly from an area between the first and second heavily doped regions, and the second gate electrode is disposed outwardly from an area between the second and third heavily doped regions.

11. A protection circuit for protecting circuitry coupled to a first bond pad, comprising:
    a first heavily doped region electrically connected to the first bond pad;
    a third heavily doped region electrically connected to a reference potential;
    a second heavily doped region disposed between the first and third heavily doped regions;
    a first gate electrode disposed outwardly from an area between the first and second heavily doped regions;
    a second gate electrode disposed outwardly from an area between the second and third heavily doped regions, and
    wherein the first gate electrode and the second gate electrode are commonly controlled by capacitive coupling in response to an electrostatic discharge event voltage at the bond pad.

12. The protection circuit of claim 11, wherein the first, second, and third heavily doped regions are doped with an n-type dopant.

13. The protection circuit of claim 11, further comprising
    a first circuit element connected between the first gate electrode and the second gate electrode; and
    a second circuit element connected between the second gate electrode and a reference potential.

14. The protection circuit of claim 11, further comprising:
    a first circuit element connected between the first gate electrode and a first reference potential; and
    a second circuit element connected between the second gate electrode and a second reference potential.

15. The protection circuit of claim 11, wherein at least a portion of the first gate electrode is disposed outwardly from a portion of the first and second heavily doped regions.

16. The protection circuit of claim 15, wherein at least a portion of the second gate electrode is disposed outwardly from a portion of the second and third heavily doped regions.

* * * * *